(12) United States Patent
Xia et al.

(10) Patent No.: US 11,406,032 B2
(45) Date of Patent: Aug. 2, 2022

(54) FOLDABLE FLEXIBLE DISPLAY DEVICE

(71) Applicant: Wuhan China Star Optoelectronics Semiconductor Display Technology Co., Ltd., Wuhan (CN)

(72) Inventors: Mingyong Xia, Wuhan (CN); Yapeng Cheng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 125 days.

(21) Appl. No.: 16/769,624

(22) PCT Filed: Dec. 3, 2019

(86) PCT No.: PCT/CN2019/122799
§ 371 (c)(1),
(2) Date: Jun. 4, 2020

(87) PCT Pub. No.: WO2021/027186
PCT Pub. Date: Feb. 18, 2021

(65) Prior Publication Data
US 2021/0410306 A1    Dec. 30, 2021

(30) Foreign Application Priority Data

Aug. 13, 2019    (CN) .......................... 201910745494.9

(51) Int. Cl.
*H05K 5/02* (2006.01)
*H05K 5/00* (2006.01)
*H05K 5/03* (2006.01)

(52) U.S. Cl.
CPC ......... *H05K 5/0226* (2013.01); *H05K 5/0017* (2013.01); *H05K 5/03* (2013.01)

(58) Field of Classification Search
None
See application file for complete search history.

(56) References Cited

U.S. PATENT DOCUMENTS

| 9,179,559 | B1 * | 11/2015 | Kim | ...................... H04M 1/0268 |
| 10,306,788 | B2 * | 5/2019 | Bi | .............................. E05D 3/06 |
| 10,575,415 | B2 * | 2/2020 | Shin | ...................... H01L 51/524 |
| 11,126,289 | B2 * | 9/2021 | Li | .......................... G06F 3/0412 |
| 11,181,942 | B1 * | 11/2021 | Feng | ...................... G06F 1/1686 |
| 2016/0357052 | A1 | 12/2016 | Kim et al. | |

(Continued)

FOREIGN PATENT DOCUMENTS

| CN | 205881905 | 1/2017 |
| CN | 106873717 | 6/2017 |

(Continued)

*Primary Examiner* — Xanthia C Cunningham

(57) ABSTRACT

A foldable flexible display device, with a design of disposing reinforcing structures on lower surfaces of a support plate, when a front surface of a flexible display device is subjected to an external impact, the reinforcing structures are able to support the sinking flexible display panel and the displacement of the flexible display device is reduced so that the back cover under the support plate is not in contact with the sinking flexible display panel. This can obviously improve the impact condition of the flexible display panel and the impact resistance of the flexible display panel, thereby preventing the flexible display panel failure caused by stress concentration.

19 Claims, 3 Drawing Sheets

(56) References Cited

U.S. PATENT DOCUMENTS

| | | |
|---|---|---|
| 2017/0192300 A1* | 7/2017 | Chung .................. H01L 27/326 |
| 2018/0122871 A1 | 5/2018 | Choi |
| 2018/0145269 A1* | 5/2018 | Myeong .............. H04M 1/0268 |
| 2018/0241115 A1* | 8/2018 | Cho .......................... H01Q 1/38 |
| 2018/0290430 A1* | 10/2018 | Liu ........................... G09F 9/30 |
| 2019/0086960 A1 | 3/2019 | Jiang et al. |
| 2019/0090364 A1* | 3/2019 | Shin ..................... H05K 5/0226 |
| 2019/0280226 A1 | 9/2019 | Myeong et al. |
| 2019/0372033 A1 | 12/2019 | Li |
| 2019/0372058 A1 | 12/2019 | Kishimoto et al. |
| 2020/0047451 A1 | 2/2020 | Dong et al. |
| 2020/0161596 A1 | 5/2020 | Kishimoto et al. |
| 2020/0359515 A1* | 11/2020 | Choi .................... G06F 1/1616 |

FOREIGN PATENT DOCUMENTS

| | | |
|---|---|---|
| CN | 108074488 | 5/2018 |
| CN | 108806508 | 11/2018 |
| CN | 109065506 | 12/2018 |
| CN | 208607861 | 3/2019 |
| JP | 6345905 | 6/2018 |
| KR | 10-2018-0047605 | 5/2018 |

\* cited by examiner

FOLDABLE FLEXIBLE DISPLAY DEVICE

RELATED APPLICATIONS

This application is a National Phase of PCT Patent Application No. PCT/CN2019/122799 having International filing date of Dec. 3, 2019, which claims the benefit of priority of Chinese Patent Application No. 201910745494.9 filed on Aug. 13, 2019. The contents of the above applications are all incorporated by reference as if fully set forth herein in their entirety.

BACKGROUND OF THE INVENTION

The present application relates to a field of display technology, and more particularly, to a foldable flexible display device.

In recent years, with the continuous development of display technology, people have higher and higher requirements for display devices, and large-sized display devices have become a development trend. Large-sized display devices improve user experience and product competitiveness, but it is inconvenient to transport these large-sized display devices. Therefore, foldable flexible display devices have emerged. A flexible display device may be folded into a small size by the foldable flexible display device, and it has many advantages such as lightweight, thinness, and portability. Therefore, it has become an important development direction for display technology. With the development of foldable electronic display technology, research on the structure of foldable display devices is also underway.

Existing foldable display devices include a flexible display panel with a foldable structure, and a cover window with a minimal thickness is used above the flexible display panel for folding. A backplate is attached below the flexible display panel. In order to ensure bending performance of the flexible display panel, a material of each film layer is relatively soft and has a low modulus, and a thicker cover glass cannot be adopted on the outer layer of which. The flexible display panel can only adopt a thin cover window, but the thin cover window has poor impact resistance, which causes devices to fail easily. In order to ensure the tactile feel on the flexible display panel, a mid-frame with higher rigidity is attached below the backplate, and a back cover is disposed below the mid-frame.

SUMMARY OF THE INVENTION

Structures designed to resist external impact (falling ball impact) is not included in existing middle frames. When the foldable display device is subjected to an external impact, a local position of the flexible display panel will sink, and it drives the mid-frame to be in contact with the back cover and generates a large reaction force, which causes the flexible display panel to fail due to stress concentration.

Therefore, how to improve the impact condition and impact resistance of the flexible display panel when the entire foldable flexible display device is subjected to an external impact to prevent flexible display panel failure caused by stress concentration. It has become a technical problem that needs to be solved in the development of foldable flexible display devices.

An object of the present application is to provide a foldable flexible display device, which is able to improve the impact condition of the flexible display panel and the impact resistance of the flexible display panel.

In order to achieve the above object, the present application provides a foldable flexible display device, comprising: a flexible display panel, comprising a fold area; a backplate, adhered to a lower surface of the flexible display panel through an adhesive layer, and the backplate comprising a first flexible area corresponding to the fold area; and a support plate, configured to receive and support the flexible display panel and the backplate, the support plate comprising a fold portion corresponding to the fold area, the support plate divided into two sub-support plates by the fold portion, and the sub-support plates having a plurality of reinforcing structures on lower surfaces of the sub-support plates, wherein a length of each of the reinforcing structures is $\frac{1}{3}$ to $\frac{1}{15}$ of a total length of the flexible display panel, a height of each of the reinforcing structures is less than or equal to 0.5 mm, and a distance between adjacent reinforcing structures is $\frac{1}{2}$ to 5 times the length of each of the reinforcing structures.

In order to achieve the above object, the present application further provides a foldable flexible display device, comprising: a flexible display panel, comprising a fold area; a backplate, adhered to a lower surface of the flexible display panel through an adhesive layer, and the backplate comprising a first flexible area corresponding to the fold area; and a support plate, configured to receive and support the flexible display panel and the backplate, the support plate comprising a fold portion corresponding to the fold area, the support plate divided into two sub-support plates by the fold portion, and the sub-support plates having a plurality of reinforcing structures on lower surfaces of the sub-support plates.

In the present application, with a design of disposing reinforcing structures on lower surfaces of the sub-support plates, when a front surface of the flexible display device is subjected to an external impact (falling ball impact), the reinforcing structures are able to support the sinking flexible display panel and the displacement of the flexible display device is reduced so that the back cover under the support plate is not in contact with the sinking flexible display panel. This can obviously improve the impact condition of the flexible display panel and the impact resistance of the flexible display panel, thereby preventing the flexible display panel failure caused by stress concentration.

BRIEF DESCRIPTION OF THE SEVERAL VIEWS OF THE DRAWINGS

In order to clearly illustrate embodiments or technical solutions in the present application, a brief description of drawings required to be used in the description of the embodiments is given below. Obviously, the drawings in the following description are merely some embodiments of the present application. For persons skilled in this art, other drawings can be obtained from these drawings under the premise of the creative labor without paying.

DESCRIPTION OF SPECIFIC EMBODIMENTS OF THE INVENTION

Figure 1:
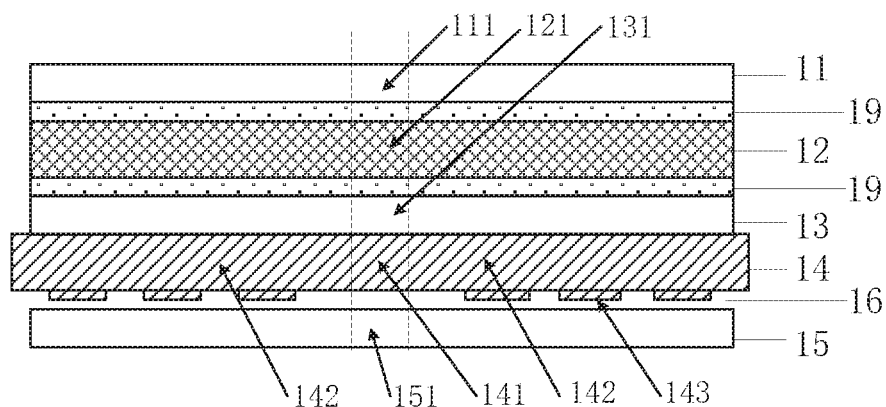
FIG. 1 is a cross-sectional view of a film layer structure of a foldable flexible display device according to an embodiment of the present application.

The embodiments of the present application are described in detail below. Examples of the embodiments are shown in the drawings, wherein the same or similar reference numbers indicate the same or similar device or a device with the same or similar functions throughout. The embodiments described below with reference to the drawings are exemplary and are only used to explain the present application, it should not be construed as a limitation to the present application.

The terms "first", "second", "third", and the like (if they present) in the description, claims, and the drawings of the present application are used to distinguish similar objects, and do not have to be used to describe a specific order or sequence. It should be understood that the objects described in this way are interchangeable where appropriate. In addition, the terms "including" and "having" and any variations thereof are intended to cover non-exclusive inclusion.

In the present application, unless otherwise specified and limited, a description of that a first feature is "above" or "below" a second feature may include the first feature is in direct contact with the second feature, and it may also include the first feature is not in contact with the second feature, but they contact each other through another feature between them. Moreover, a description of that the first feature is "above", "on", and "up" the second feature includes that the first feature is directly above and diagonally above the second feature, or it only means that the height level of the first feature is higher than that of the second feature. A description of that the first feature is "below", "under" and "down" the second feature includes that the first feature is directly below and diagonally below the second feature, or it only means that the height level of the first feature is lower than that of the second feature.

The following disclosure provides many different embodiments or examples for realizing different structures of the present application. In order to simplify the disclosure of the present application, the components and settings of specific examples are described below. Of course, they are merely examples and are not intended to limit the present application. In the present application, the numbers and/or letters may be referred repeatedly in different examples for the purpose of simplicity and clarity, it does not indicate the relationship between the various embodiments and/or settings discussed. In addition, the present application provides examples of various specific processes and materials, but persons skilled in this art may be aware of the application of other processes and/or the use of other materials.

The present application proposes an embodiment with a new type of a foldable flexible display device. The foldable flexible display device includes: a flexible display panel with a fold area; a backplate, which is adhered to a lower surface of the flexible display panel through an adhesive layer, and the backplate includes a flexible area corresponding to the fold area; and a support plate, which is configured to receive and support the flexible display panel and the backplate, and the support plate includes a fold portion corresponding to the fold area. The support plate is divided into two sub-support plates by the fold portion, and the sub-support plates having a plurality of reinforcing structures on lower surfaces of the sub-support plates. With a design of disposing reinforcing structures on lower surfaces of the support plate, when a front surface of the flexible display device is subjected to an external impact (falling ball impact), the reinforcing structures are able to support the sinking flexible display panel and the displacement of the flexible display device is reduced so that the back cover under the support plate is not in contact with the sinking flexible display panel. This can obviously improve the impact condition of the flexible display panel and the impact resistance of the flexible display panel, thereby preventing the flexible display panel failure caused by stress concentration.

Figure 2:
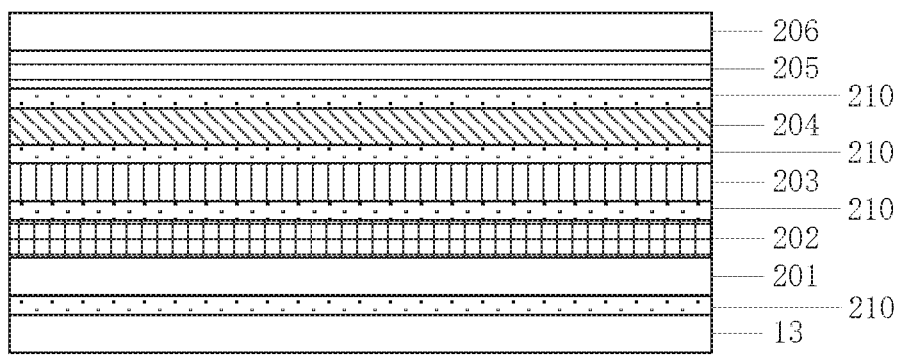
FIG. 2 is a cross-sectional view of a film layer structure of a flexible display device according to the embodiment of the present application.
Figure 3:
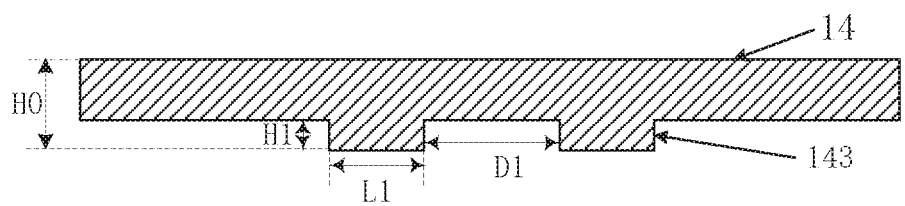
FIG. 3 is a front view of a schematic structural diagram showing a support plate according to the embodiment of the present application.
Figure 4A:
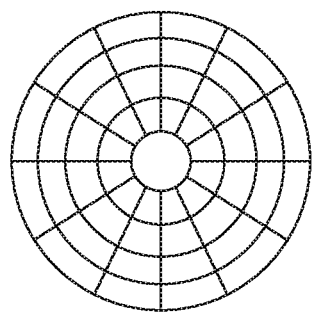
FIGS. 4A, 4B and 4C are upward views of schematic structural diagrams showing reinforcing structures according to the embodiment of the present application.
Figure 4B:
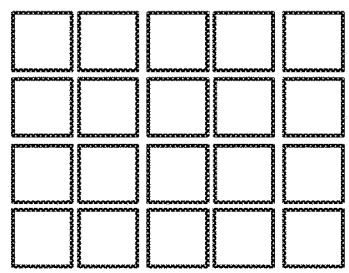
Figure 4C:
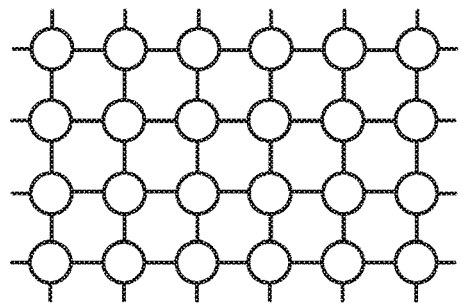

Referring to FIG. 1 to FIG. 3 and FIG. 4A to FIG. 4C together, FIG. 1 is a cross-sectional view of a film layer structure of a foldable flexible display device according to an embodiment of the present application. FIG. 2 is a cross-sectional view of a film layer structure of a flexible display device according to the embodiment of the present application. FIG. 3 is a front view of a schematic structural diagram showing a support plate according to the embodiment of the present application. FIGS. 4A-4C are upward views of schematic structural diagrams showing reinforcing structures according to the embodiment of the present application.

As shown in FIG. 1, the foldable flexible display device of the present application includes a cover window 11, a flexible display panel 12, a backplate 13, and a support plate (or a set-frame) 14, and a back cover 15 from top to bottom.

The flexible display panel 12 includes a fold area 121 and other areas (that is, non-fold areas). The flexible display panel 12 is used for displaying images.

As shown in FIG. 2, the flexible display panel 12 may include a substrate 201 prepared by polyimide (PI). An array layer 202, a polarizer (POL) 203, a PET plastic layer 204, and a flexible plastic film (such as a colorless polyimide, CPI) layer 205 are stacked in sequence on the substrate 201. An optically clear adhesive (OCA) 210 is used for adhering between film layers. A hard coating layer (HC) 206 is also disposed on the flexible plastic film layer 205. The bottom of the substrate 201 is adhered to the backplate 13 through the OCA 210. It is not limited to the above embodiments according to the flexible display panel of the present application, and it can be widely applied to foldable display devices including a thin film transistor array and an organic light-emitting array.

Referring to FIG. 1 again, the backplate 13 is adhered to lower surfaces of the flexible display panel 12 through an adhesive layer 19. The backplate 13 includes a first flexible area 131 corresponding to the fold area 121. The first flexible area 131 may be formed of a foldable flexible material, thereby realizing folding capability in the first flexible area 131. The rest areas of the backplate 13 may include a rigid area with higher rigidity (such as predetermined rigidity) than the first flexible area 131. The flexible area and the rigid area may be integrally formed of the same kind of materials with different hardnesses, but the present application is not limited to this. Since the backplate 13 has a less thickness, it can be folded. The backplate 13 has supporting functions (such as predetermined supporting force) for supporting the flexible display panel 12. A material adopted by the adhesive layer 19 may be an OCA.

The cover window 11 is adhered to an upper surface of the flexible display panel 12 through an adhesive layer 19. The cover window 11 covers the upper surface of the flexible display panel 12 and includes a second flexible area 111 corresponding to the fold area 121. The second flexible area 111 may be formed of a foldable flexible material, thereby realizing folding capability in the second flexible area 111. The rest areas of the cover window 11 may include a rigid area with higher rigidity (such as predetermined rigidity) than the second flexible area 111. The flexible area and the rigid area may be integrally formed of the same kind of materials with different hardnesses, but the present application is not limited to this. Since the cover window 11 has a less thickness, it can be folded. The cover window 11 may have the same length as the flexible display panel 12 or have a greater length than the flexible display panel 12. A material adopted by the adhesive layer 19 may be an OCA.

The support plate 14 is configured to receive and support the flexible display panel 12 and the backplate 13. The support plate 14 includes a fold portion 141 corresponding to the fold area 121. The support plate 14 is divided into two sub-support plates 142 by the fold portion 141. Each of the sub-support plates 142 has a plurality of reinforcing structures 143 on a lower surface of the sub-support plate 142. The support plate 14 may have a mid-frame protruding from the main part of the support plate to accommodate the flexible display panel 12 and the backplate 13. The main part of the support plate may provide fixing and supporting functions (such as a predetermined fixing and supporting force) for the flexible display panel 12 and the backplate 13. The two sub-support plates 142 may rotate around the fold portion 141 and thus the fordable flexible display device is foldable.

In a further embodiment, a material of the support plate 14 may be a metal material (such as aluminum alloy and stainless steel) or a hard plastic material to provide a fixing force and a supporting force.

Optionally, a material of the reinforcing structures 143 may be same as a material of the support plate 14, that is, the material of the reinforcing structures 143 may also be a metal material (such as aluminum alloy and stainless steel) or a hard plastic material. The reinforcing structures 143 and the sub-support plates 142 corresponding to the reinforcing structures 143 adopting the same material may be formed as an integrated structure. When the flexible display device is subjected to an impact, the integrated structure can support the flexible display panel 12 as much as possible to slow down the sinking, thereby effectively alleviating a phenomenon of larger stress concentration on the flexible display panel 12 and improving an impact resistance thereof. A method for manufacturing the reinforcing structures 143 includes, but is not limited to, CNC (computerized numerical control) processing, 3D printing, and the like.

Optionally, the material of the reinforcing structure 143 may also be different from the material of the support plate 14. For example, the reinforcing structures 143 are made of a cushioning material, such as rubber and foam, which can effectively absorb impact energy to ensure the impact resistance of the entire flexible display device. The reinforcing structures 143 and the sub-support plate 142 corresponding to the reinforcing structures 143 adopting different materials may be bonded together by means of adhesion or the like. For example, the reinforcing structures 143 may be adhered to lower surfaces of the sub-support plates 142 through an adhesive layer. The adhesive layer may be an OCA.

The back cover 15 is disposed below the support plate 14 and, a gap 16 is provided between the back cover 15 and the support plate 14. The back cover 15 includes a plug-in portion 151 corresponding to the fold area 121, and the back cover is divided into left and right parts by the plug-in portion 151, thereby realizing folding capability in the plug-in portion 151. Wherein, a height of the gap 16 is greater than a height of the reinforcing structures 143, that is, the bottom of the support plate 14 including the reinforcing structures 143 is not in contact with the back cover 15. The support plate 14 may be further configured to receive the back cover 15. Therefore, in the foldable display device according to the present application, the cover window 11, the flexible display panel 12, the backplate 13, the support plate 14, and the back cover 15 are all foldable. The back cover 15 may be fixed for surrounding the support plate 14. The back cover 15 provides sufficient strength (such as predetermined strength) to prevent or reduce possible deformation for the foldable flexible display device of the present application.

In a further embodiment, the gap 16 may be filled with a cushioning material, such as rubber and foam, which can further absorb impact energy to ensure the impact resistance of the entire flexible display device. A height of the gap 16 is generally less than 0.3 mm.

As shown in FIG. 3, a length L1 of each of the reinforcing structures 143 may be ⅓ to ¹/₁₅ of a total length of the support plate 14 (or a total length of the flexible display panel 12). A height H1 of the reinforcing structures 143 is less than or equal to 0.5 mm, and a height of the gap 16 is greater than the height of the reinforcing structures 143. A distance D1 between adjacent reinforcing structures 143 is ½ to 5 times the length L1 of each of the reinforcing structures 143. In order to ensure a thickness of the entire device, a total height H0 of the support plate 14 is generally not greater than 1.5 mm, and a height H1 of the reinforcing structures 143 is generally not greater than 0.3 mm. The size, distribution, etc. of the reinforcing structures 143 may be optimized with reference to the actual display panel size.

The shape of the reinforcing structures 143 includes, but is not limited to, a rectangle, a triangle, a trapezoid, a circle, and the like, or a combination thereof. Different structures are designed according to a requirement for improving the impact resistance. FIG. 4A shows circular reinforcing structures, FIG. 4B shows rectangular reinforcing structures, and FIG. 4C shows hybrid reinforcing structures composed of circle and rectangle reinforcing structures.

With a design of disposing reinforcing structures on lower surfaces of the support plate, when a front surface of the flexible display device is subjected to an external impact, the reinforcement structures are able to support the sinking flexible display panel and the displacement of the flexible display device is reduced so that the back cover under the support plate is not in contact with the sinking flexible display panel. This can obviously improve the impact condition of the flexible display panel and the impact resistance of the flexible display panel, thereby preventing the flexible display panel failure caused by stress concentration.

Figure 5:
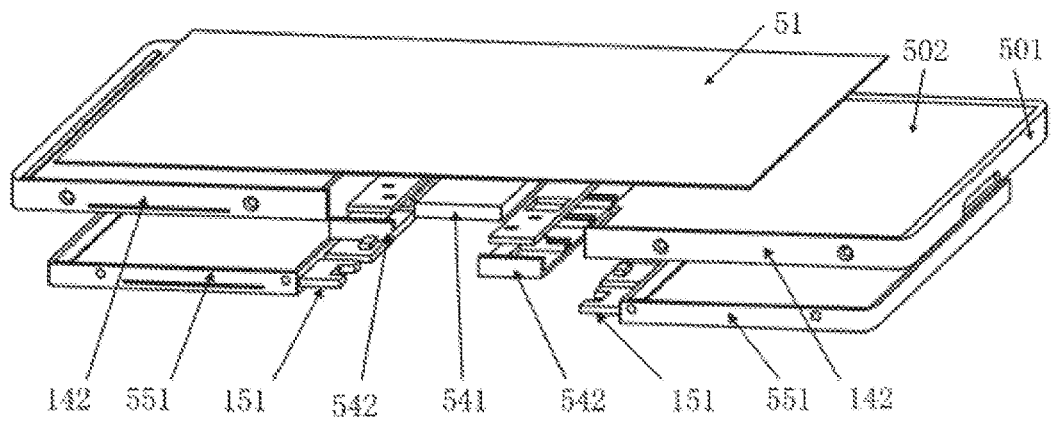
FIG. 5 is a schematic structural diagram showing the foldable flexible display device according to the embodiment of the present application.
Figure 6A:
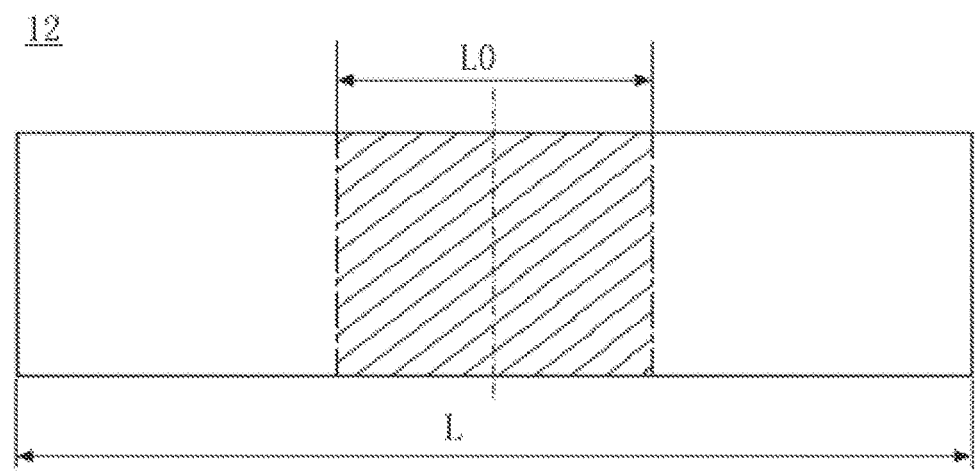
FIG. 6A is a top view of a schematic diagram showing the flexible display panel in an expanded state according to the present application.
Figure 6B:
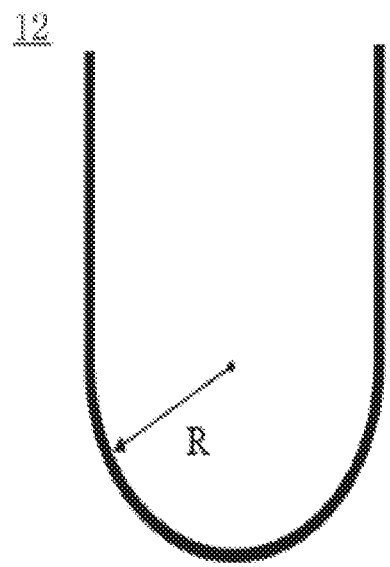
FIG. 6B is a side view of a schematic diagram showing the flexible display panel in a foldable state according to the present application.

Referring to FIG. 5 and FIG. 6A to FIG. 6B together, wherein FIG. 5 is a schematic structural diagram showing the foldable flexible display device according to the embodiment of the present application, FIG. 6A is a top view of a schematic diagram showing the flexible display panel in an expanded state according to the present application, and FIG. 6B is a side view of a schematic diagram showing the flexible display panel in a foldable state according to the present application.

As shown in FIG. 5, the foldable flexible display device includes a flexible display module 51, a support plate 14, and a back cover 15. The flexible display module 51 includes a cover window 11, a flexible display panel 12, and a backplate 13 as shown in FIG. 1, and their structure setting may refer to the aforementioned description, and no further elaboration on details will be made.

Referring to FIG. 1 and FIG. 5 at the same time, the support plate 14 is configured to receive and support the flexible display module 51. The support plate 14 includes the fold portion 141 corresponding to the fold area 121 (shown in FIG. 1) of the flexible display panel 12. The support plate 14 is divided into two sub-support plates 142 by the fold portion 141, and the sub-support plates 142 have a plurality of reinforcing structures 143 (shown in FIG. 1) on lower surfaces of the sub-support plates. The two sub-support plates 142 may rotate around the fold portion 141, and thereby the foldable flexible display panel is foldable. The sub-support plates 142 has a protruding middle-frame 501 for accommodating the flexible display module 51 and has a main part of the support plate 502 for providing fixing and supporting functions (such as a predetermined fixing and supporting force) to the flexible display module 51. A material, structure, and setting of the reinforcing structures 143 may refer to the aforementioned description, and no further elaboration on details will be made. The mid-frame 501 surrounds the main part of the support plate 502.

The fold portion 141 includes a hinge portion 541 and two flexible-sliders (or spring-slider) 542. The hinge portion 541 is formed in an area of the support plate 14 corresponding to the fold area 121, and the flexible-sliders 542 is also formed in an area of the support plate 14 corresponding to the fold area 121. Two ends of each of flexible-sliders 542 are connected to the hinge portion 541 and to one of the sub-support plates 143, respectively, and the flexible-sliders 542 slid along opposite directions and rotate around the hinge portion 541 after the sliding movements, so that the foldable flexible display device is foldable. That is, in an area corresponding to the fold area 121, the flexible display module 51 is not adhered to the support plate 14, the flexible display module 51 is in a free state. When the hinge portion 541 rotates, the two flexible-sliders 542 are driven to slide left and right, respectively, and the two sub-support plates 142 are separated, thereby realizing folding capability.

Referring to FIG. 1 and FIG. 5 at the same time, the back cover 15 is disposed below the support plate 14 and a gap 16 (shown in FIG. 1) is disposed between the back cover 15 and the support plate 14. The back cover 15 includes a plug-in portion 151 corresponding to the fold area 121, and the back cover 15 is divided into two sub-back covers 551 by the plug-in portion 151, thereby realizing folding capability in the plug-portion 151. The two sub-back covers 551 are plugged and combined into one through the plug-in portion 151. When the foldable flexible display device is folded, it is separated into two parts by the separation of the plug-in portion 151, thereby realizing folding capability. Therefore, in the foldable display device according to the present application, the flexible display module 51, the support plate 14, and the back cover 15 are all foldable.

Wherein, a height of the gap 16 is greater than a height of the reinforcing structures 143, that is, the bottom of the support plate 14 including the reinforcing structures 143 is not in contact with the back cover 15. The support plate 14 may be further configured to receive the back cover 15. The back cover 15 may be fixed for surrounding the support plate 14. The back cover 15 provides sufficient strength (such as predetermined strength) to prevent or reduce possible deformation for the foldable flexible display device of the present application. In a further embodiment, the gap 16 may be filled with a cushioning material, such as rubber and foam, which can further absorb impact energy to ensure the impact resistance of the entire flexible display device. A height of the gap 16 is generally less than 0.3 mm.

As shown in FIG. 6A to FIG. 6B, it is assumed that a total length of the flexible display panel 12 is L, which includes a fold area 121 with a length (or an arc length) of L0, and a bending radius thereof is R (the current technology development is mainly 3 mm or 5 mm). After the flexible display panel 12 is folded from the expanded state as shown in FIG. 6A to the folded state as shown in FIG. 6B, a length change amount on two sides of the flexible display panel 12 is $L0-2R=\pi R/2-2R$. Since the two flexible-sliders 542 are driven to slide left and right respectively when the hinge portion 541 rotates, a length difference $\pi R/2-2R$ between a semicircle state and the expanded state can be compensated so that the flexible display panel 12 in the fold area is not subjected to a pulling force.

Figure 7A:
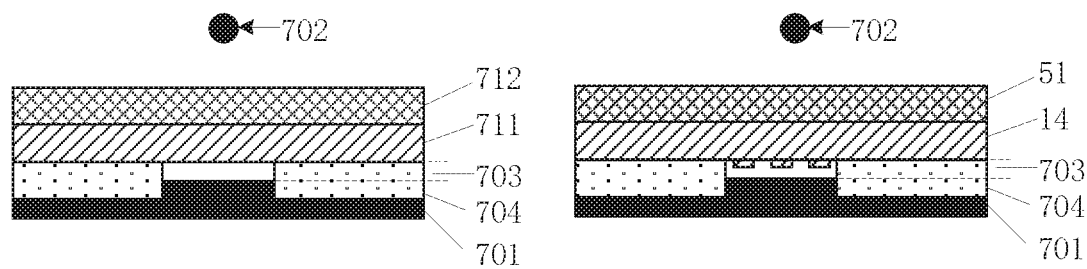
FIGS. 7A-7B are schematic diagrams showing a simulation experiment with a falling ball.
Figure 7B:
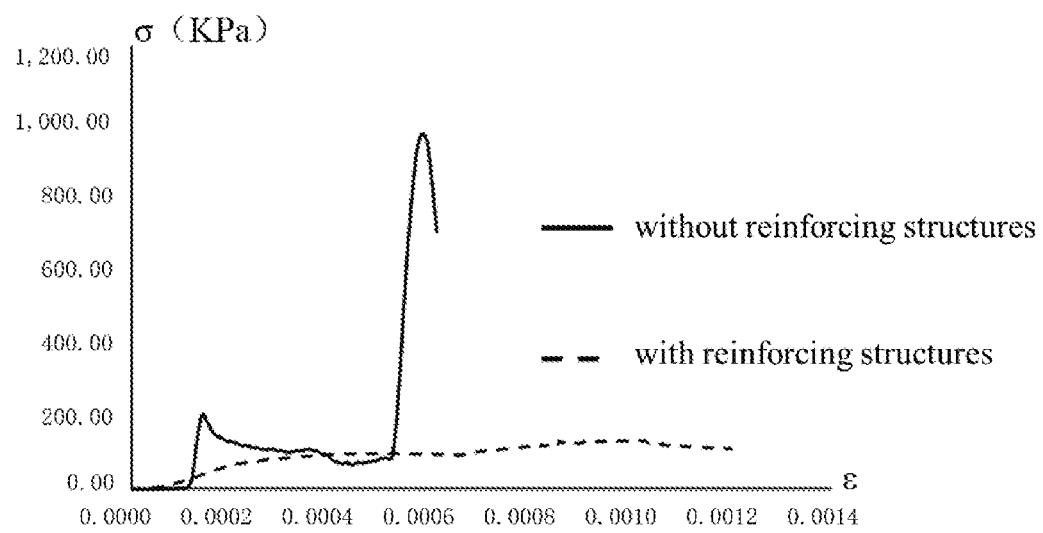

Referring to FIG. 7A to FIG. 7B, schematic diagrams show a simulation experiment with a falling ball, wherein the figure on the left of FIG. 7A shows a flexible display module 712 adopting existing support plate 711 without reinforcing structures, and the figure on the right of FIG. 7A shows a flexible display module 51 adopting a support plate 14 with reinforcing structures according to the present application. A flexible display module and a support plate corresponding to the flexible display module are placed on an experimental fixture 701, and a small ball 702 drops from different heights for a ball drop simulation experiment. There is a gap 703 between the support plate and the experimental fixture 701 in an experimental area, which simulates the gap between the support plate and the back cover. A rubber layer 704 is disposed between the support plate and the experimental fixture 701 in a non-experimental area for buffering. The diameter of the small ball 702 may be 20 mm, the weight thereof may be 32.88 g, and it drops from a distance of 2 cm from an upper surface of the flexible display module for the experiment.

In FIG. 7B, the horizontal axis is strain $\varepsilon$, and the vertical axis is stress a (unit KPa). As can be seen from FIG. 7B, when the flexible display module on the support plate with the reinforced structures is subjected an impact by the falling ball, the maximum instantaneous stress is significantly alleviated.

It can be understood that for persons skilled in the art, equivalent replacements or changes can be made according to the technical solution and invention concept of the present application, and all these changes or replacements should belong the protection scope of the claims attached to the present application.

What is claimed is:

1. A foldable flexible display device, comprising:
   a flexible display panel, comprising a fold area;
   a backplate adhered to a lower surface of the flexible display panel through an adhesive layer, and the backplate comprising a first flexible area corresponding to the fold area; and
   a support plate configured to receive and support the flexible display panel and the backplate, the support plate comprising a fold portion corresponding to the fold area, the support plate divided into two sub-support plates by the fold portion, and the sub-support plates having a plurality of reinforcing structures on lower surfaces of the sub-support plates,
   wherein a length of each of the reinforcing structures is $\frac{1}{3}$ to $\frac{1}{15}$ of a total length of the flexible display panel, a height of each of the reinforcing structures is less than or equal to 0.5 mm, and a distance between adjacent reinforcing structures is ½ to 5 times the length of each of the reinforcing structures.

2. The foldable flexible display device as claimed in claim 1, wherein the reinforcing structures are shaped as at least one of a rectangle, a triangle, a trapezoid, and a circle.

3. The foldable flexible display device as claimed in claim 1, wherein a material of the reinforcing structures is same as that of the support plate and is one of a metal material and a hard plastic material.

4. The foldable flexible display device as claimed in claim 3, wherein the reinforcing structures and the sub-support plates corresponding to the reinforcing structures are formed as an integrated structure.

5. The foldable flexible display device as claimed in claim 1, wherein the reinforcing structures are made of a cushioning material and are adhered to the lower surfaces of the sub-support plates through an adhesive layer.

6. The foldable flexible display device as claimed in claim 1, wherein the fold portion comprises:
   a hinge portion formed in an area of the support plate corresponding to the fold area;
   two flexible-sliders formed in the area of the support plate corresponding to the fold area, two ends of each of the flexible-sliders connected to the hinge portion and to one of the sub-support plates, respectively, and the flexible-sliders sliding along opposite directions and rotating around the hinge portion after sliding movements.

7. The foldable flexible display device as claimed in claim 1, further comprising:
   a cover window adhered to an upper surface of the flexible display panel through an adhesive layer, the cover window covering the upper surface of the flexible display panel, and comprising a second flexible area corresponding to the fold area; and
   a back cover disposed below the support plate, a gap provided between the back cover and the support plate, the back cover comprising a plug-in portion corresponding to the fold area, and the back cover divided into two parts by the plug-in portion, wherein a height of the gap is greater than a height of each of the reinforcing structures.

8. The foldable flexible display device as claimed in claim 7, wherein the gap is filled with a cushioning material.

9. A foldable flexible display device, comprising:
   a flexible display panel, comprising a fold area;
   a backplate adhered to a lower surface of the flexible display panel through an adhesive layer, and the backplate comprising a first flexible area corresponding to the fold area; and
   a support plate configured to receive and support the flexible display panel and the backplate, the support plate comprising a fold portion corresponding to the fold area, the support plate divided into two sub-support plates by the fold portion, and the sub-support plates having a plurality of reinforcing structures on lower surfaces of the sub-support plates, wherein a length of each of the reinforcing structures is ⅓ to 1/15 of a total length of the flexible display panel.

10. The foldable flexible display device as claimed in claim 9, wherein the reinforcing structures are shaped as at least one of a rectangle, a triangle, a trapezoid, and a circle.

11. The foldable flexible display device as claimed in claim 9, wherein a height of each of the reinforcing structures is less than or equal to 0.5 mm.

12. The foldable flexible display device as claimed in claim 9, wherein a distance between adjacent reinforcing structures is ½ to 5 times the length of each of the reinforcing structures.

13. The foldable flexible display device as claimed in claim 9, wherein a material of the reinforcing structures is same as that of the support plate and is one of a metal material and a hard plastic material.

14. The foldable flexible display device as claimed in claim 13, wherein the reinforcing structures and the sub-support plates corresponding to the reinforcing structures are formed as an integrated structure.

15. The foldable flexible display device as claimed in claim 9, wherein the reinforcing structures are made of a cushioning material and are adhered to the lower surfaces of the sub-support plates through an adhesive layer.

16. The foldable flexible display device as claimed in claim 9, wherein the fold portion comprises:
   a hinge portion formed in an area of the support plate corresponding to the fold area;
   two flexible-sliders formed in the area of the support plate corresponding to the fold area, two ends of each of the flexible-sliders connected to the hinge portion and to one of the sub-support plates, respectively, and the flexible-sliders sliding along opposite directions and rotating around the hinge portion after sliding movements.

17. The foldable flexible display device as claimed in claim 9, wherein a material adopted by the adhesive layer is an optically clear adhesive (OCA).

18. The foldable flexible display device as claimed in claim 9, wherein the foldable flexible display device further comprising:
   a cover window adhered to an upper surface of the flexible display panel through an adhesive layer, the cover window covering the upper surface of the flexible display panel, and comprising a second flexible area corresponding to the fold area; and
   a back cover, disposed below the support plate, a gap provided between the back cover and the support plate, the back cover comprising a plug-in portion corresponding to the fold area, and the back cover divided into two parts by the plug-in portion, wherein a height of the gap is greater than a height of each of the reinforcing structures.

19. The foldable flexible display device as claimed in claim 18, wherein the gap is filled with a cushioning material.

* * * * *